(12) United States Patent
Ahn

(10) Patent No.: US 6,518,135 B1
(45) Date of Patent: Feb. 11, 2003

(54) METHOD FOR FORMING LOCALIZED HALO IMPLANT REGIONS

(75) Inventor: Jae-Gyung Ahn, Palo Alto, CA (US)

(73) Assignee: Integrated Device Technology, Inc., Santa Clara, CA (US)

(*) Notice: Subject to any disclaimer, the term of this patent is extended or adjusted under 35 U.S.C. 154(b) by 0 days.

(21) Appl. No.: 09/961,484

(22) Filed: Sep. 24, 2001

(51) Int. Cl.$^7$ .............................................. H01L 21/336
(52) U.S. Cl. ...................... 438/302; 438/300; 438/303; 438/306; 438/525
(58) Field of Search ................................ 438/525, 300, 438/302, 303, 305

(56) References Cited

U.S. PATENT DOCUMENTS

| | | | |
|---|---|---|---|
| 5,364,807 A | 11/1994 | Hwang | 437/44 |
| 5,492,847 A | * 2/1996 | Kao et al. | 438/302 |
| 5,532,508 A | 7/1996 | Kaneko et al. | 257/336 |
| 5,793,088 A | 8/1998 | Choi et al. | 257/408 |
| 5,908,313 A | * 6/1999 | Chau et al. | 438/299 |
| 6,127,710 A | 10/2000 | Choi et al. | 257/410 |
| 6,190,980 B1 | 2/2001 | Yu et al. | 438/302 |
| 6,225,229 B1 | 5/2001 | Huster | 438/696 |
| 6,432,754 B1 | * 8/2002 | Assaderaghi et al. | 438/149 |

FOREIGN PATENT DOCUMENTS

| | | | |
|---|---|---|---|
| EP | 789400 | * | 8/1997 |
| EP | 923119 | * | 6/1999 |
| JP | 09-045906 | * | 2/1997 |
| JP | 11-238879 | * | 8/1999 |
| JP | 2001-024186 | * | 1/2001 |

\* cited by examiner

Primary Examiner—Trung Dang
(74) Attorney, Agent, or Firm—Victor Okumoto, Esq.

(57) ABSTRACT

A method for forming a localized halo implant region, comprises: implanting a first dosage of ions of a first type toward a surface of a substrate having a gate electrode formed thereon, so as to form a lightly doped region adjacent to the gate electrode; forming a disposable spacer on a sidewall of the gate electrode; forming an elevated source/drain structure adjacent to the disposable spacer; implanting a second dosage of ions of the first type toward the surface of the substrate so as to form a heavily doped region adjacent to the disposable spacer; removing the disposable spacer; and tilt-angle implanting at least one dosage of ions of a second type toward a gap created by the disposable spacer having been removed so as to form a localized halo implant region in the substrate, preferably by utilizing shadow effects of the gate electrode and the elevated source/drain structure.

22 Claims, 4 Drawing Sheets

METHOD FOR FORMING LOCALIZED HALO IMPLANT REGIONS

FIELD OF THE INVENTION

The present invention generally relates to the manufacture of semiconductor devices and in particular, to a method for forming localized halo implant regions.

BACKGROUND OF THE INVENTION

The usefulness of halo implant regions to reduce undesirable short channel effects such as punch-through leakage in CMOS FET semiconductor devices is well known. Conventional methods for forming such halo implant regions, however, are also known to generate undesirable sheet resistance characteristics resulting in increased threshold voltages and resistances at the source and drain contact points, that increasingly worsen as device feature sizes shrink. Another common drawback of such conventionally formed halo implant regions is increased junction capacitance. Since many halo-implanted ions are located near the junction of the heavily doped source/drain and substrate, the junction capacitance value becomes significantly increased. Since this tends to reduce circuit speed, it is a major factor in limiting the amount of the halo implant dose.

OBJECTS AND SUMMARY OF THE INVENTION

Accordingly, it is an object of the present invention to provide a method for forming a localized halo implant region that provides generally improved sheet resistance and junction capacitance characteristics.

Another object is to provide a method for forming a localized halo implant region that is cost effective to manufacture.

These and additional objects are accomplished by the various aspects of the present invention, wherein briefly stated, one aspect is a method for forming a localized halo implant region, comprising: tilt-angle implanting at least one dosage of ions toward a gap created by removal of a disposable spacer between a gate electrode and an elevated source/drain structure on a substrate so as to form a localized halo implant region in the substrate.

In another aspect, a method for forming a localized halo implant region, comprising: implanting a first dosage of ions of a first type toward a surface of a substrate having a gate electrode formed thereon, so as to form a lightly doped region adjacent to the gate electrode; forming a disposable spacer on a sidewall of the gate electrode; forming an elevated source/drain structure adjacent to the disposable spacer; implanting a second dosage of ions of the first type toward the surface of the substrate so as to form a heavily doped region adjacent to the disposable spacer; removing the disposable spacer; and tilt-angle implanting at least one dosage of ions of a second type toward a gap created by the disposable spacer having been removed, so as to form a localized halo implant region in the substrate.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

Figure 1A:
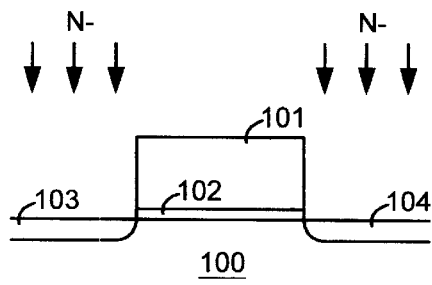
FIGS. 1a~1f illustrate, as an example, a method for forming a localized halo implant region, utilizing aspects of the present invention.
Figure 1B:
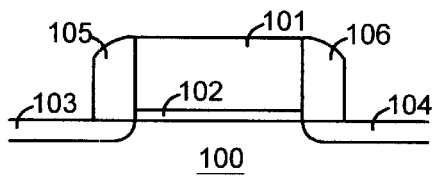
Figure 1C:
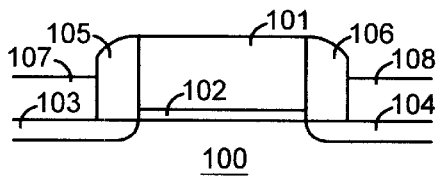
Figure 1D:
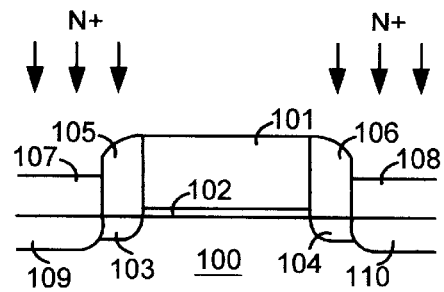

FIGS. 1a~1f illustrate, as an example, a method for forming a localized halo implant region. The method starts with a gate electrode 101 having a gate oxide layer 102 already formed on a surface of a substrate 100. In FIG. 1a, an N− dosage of ions is irradiated toward the surface of the substrate 100 using conventional ion implantation techniques to form lightly doped N− regions 103 and 104 on opposite sides of and adjacent to the gate electrode 101. In FIG. 1b, disposable spacers 105 and 106 are conventionally formed on opposite sidewalls of the gate electrode 101. In FIG. 1c, elevated or raised source/drain structures 107 and 108 are conventionally formed adjacent to and abutting corresponding spacers 105 and 106. In FIG. 1d, an N+ dosage of ions is irradiated toward the surface of the substrate 100 using conventional ion implantation techniques to form heavily doped N+ regions 109 and 110, which combine with the lightly doped N− regions 103 and 104 to form conventional source and drain regions on opposite sides of the gate electrode 101.

Figure 1E:
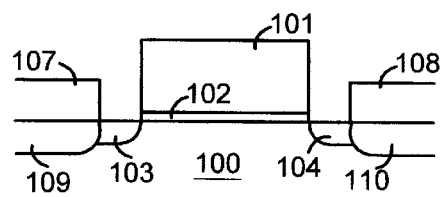
Figure 1F:
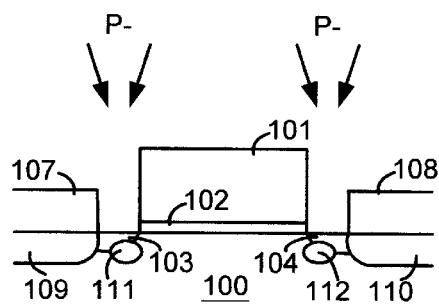

In FIG. 1e, the disposable spacers 105 and 106 are removed, leaving gaps created by the removal of the spacers 105 and 106 that resided between the gate electrode 101 and the elevated source/drain structures 107 and 108. In FIG. 1f, preferably four P− dosage of ions are irradiated from different directions using conventional tilt-angle implantation techniques towards the gaps created by removal of the disposable spacers 105 and 106, so as to form localized halo implant regions 111 and 112 in the substrate 100. Preferably, these halo implant regions are formed by utilizing shadow effects of the gate electrode 101 and elevated source/drain structures 107 and 108.

Figure 2:
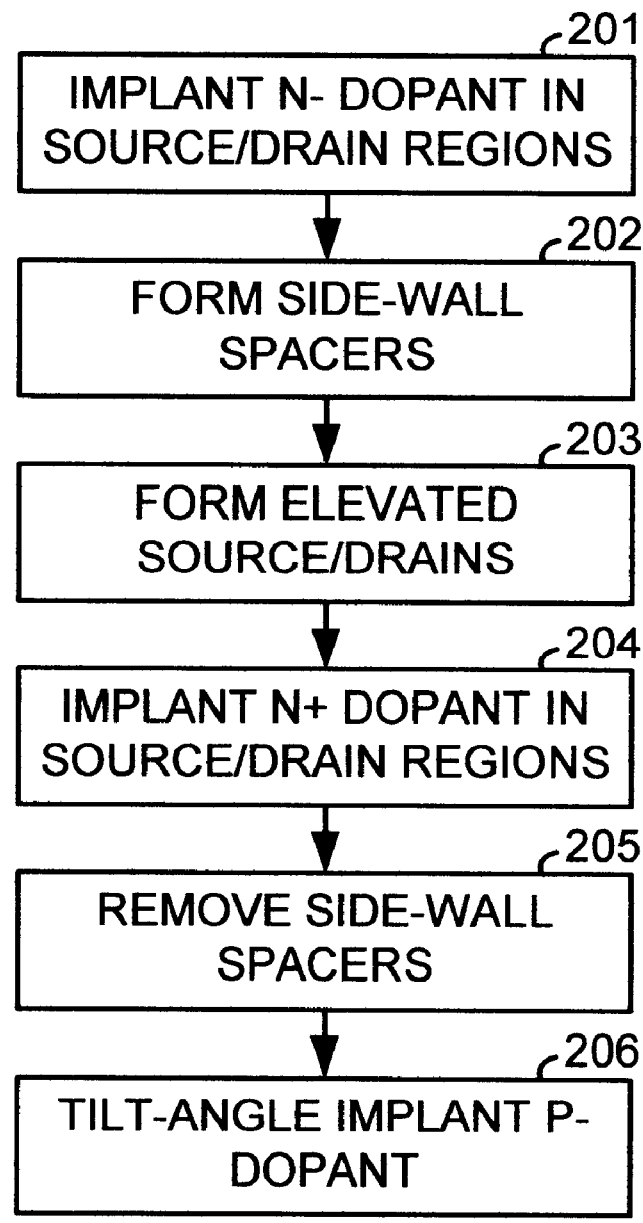
FIG. 2 illustrates, as an example, a flow diagram of a method for forming a localized halo implant region, utilizing aspects of the present invention.

FIG. 2 illustrates, as an example, a flow diagram of a method for forming a localized halo implant region. In 201, the method includes implanting a first dosage of ions of a first type toward a surface of a substrate having a gate electrode formed thereon, so as to form a lightly doped region adjacent to the gate electrode. In a first embodiment, this first dosage of ions comprises an N− dosage of ions such as Arsenic. In a second embodiment, the first dosage of ions comprises a P− dosage of ions such as Boron. In 202, the method includes forming a disposable spacer on a sidewall of the gate electrode. In 203, the method includes forming an elevated source/drain structure adjacent to the disposable spacer. The elevated source/drain structure may be formed using a conventional technique such as chemical vapor deposition or epitaxial growth. In 204, the method includes implanting a second dosage of ions of the first type toward the surface of the substrate so as to form a heavily doped region adjacent to the disposable spacer. In the first embodiment, this second dosage of ions comprises an N+ dosage of ions such as Arsenic. In the second embodiment, the second dosage of ions comprises a P+ dosage of ions such as Boron.

In 205, the method includes removing the disposable spacer. Preferably, this is accomplished through a wet etch procedure. In 206, the method includes tilt-angle implanting at least one dosage of ions of a second type toward a gap created by the disposable spacer having been removed, so as to form a localized halo implant region in the substrate. Preferably, the localized halo implant region is formed by utilizing shadow effects of the gate electrode and the elevated source/drain structure. In the first embodiment, this at least one dosage of ions comprises a P− dosage of ions such as Boron. In the second embodiment, the at least one dosage of ions comprises an N− dosage of ions such as Phosphorous.

Figure 3:
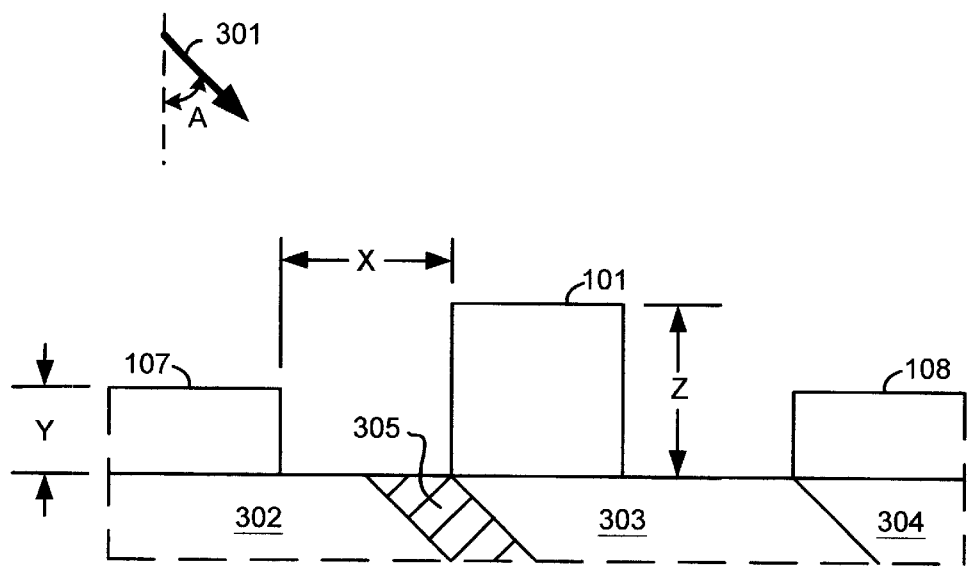
FIG. 3 illustrates, as an example, a cross-sectional side view of a semiconductor device substrate as a dosage of ions is tilt-angle implanted from one direction towards the substrate, utilizing aspects of the present invention.

FIG. 3 illustrates, as an example, a cross-sectional side view of a semiconductor device substrate. A dosage of ions 301 is tilt-angle implanted from one direction towards a gap created by the removal of the disposable spacer 105 between the gate electrode 101 and the elevated source/drain structure 107. The tilt-angle "A" is a non-orthogonal angle (relative to the surface of the substrate) from an axis (shown by a dotted line in the figure) that is orthogonal to the surface of the substrate.

The non-orthogonal tilt-angle is selected in consideration of a height "Y" of the elevated source/drain structure 107 from the surface of the substrate, a height "Z" of the gate electrode 101 from the surface of the substrate, and a width "X" between facing sidewalls of the elevated source/drain structure 107 and the gate electrode 101. In particular, the tilt-angle "A" is selected such that shadow region 303 of the gate electrode 101 at least meets shadow region 304 of the elevated source/drain structure 108, while shadow region 302 of the elevated source/drain structure 107 does not meet shadow region 303 of the gate electrode 101, thus implanting the dosage of ions 301 into an exposed region 305 resulting in the formation of the halo implant region 111 depicted in FIG. 1f.

Figure 4:
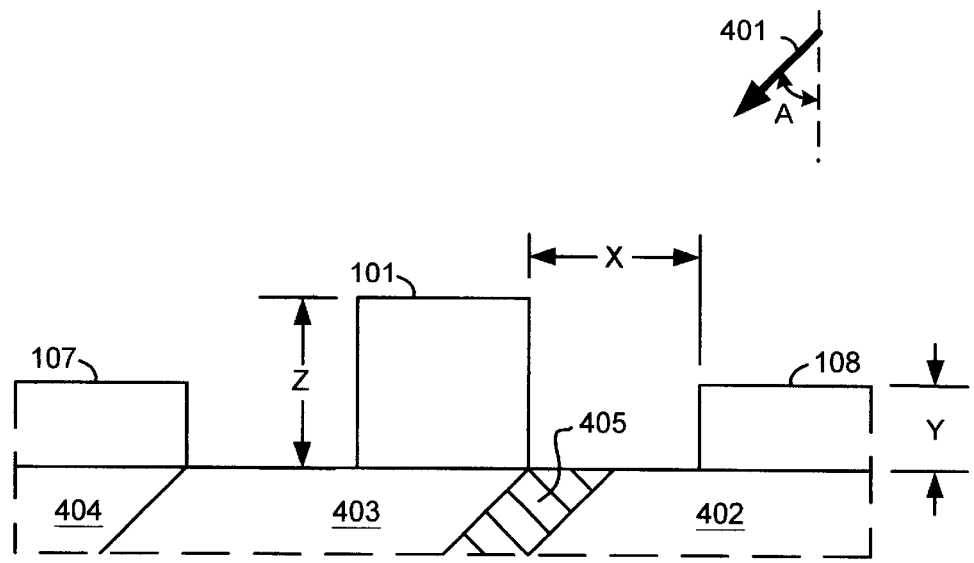
FIG. 4 illustrates, as an example, a cross-sectional side view of a semiconductor device substrate as a dosage of ions is tilt-angle implanted from another direction towards the substrate, utilizing aspects of the present invention.

FIG. 4 illustrates, as an example, the same cross-sectional side view of the semiconductor device substrate depicted in FIG. 3. A dosage of ions 401 is tilt-angle implanted this time from an opposite direction towards a gap created by the removal of the disposable spacer 106 between the gate electrode 101 and the elevated source/drain structure 108. The tilt-angle "A" is again a non-orthogonal angle (relative to the surface of the substrate) from an axis (shown by a dotted line in the figure) that is orthogonal to the surface of the substrate.

As described in reference to FIG. 3, the non-orthogonal tilt-angle is selected in consideration of a height "Y" of the elevated source/drain structure 108 from the surface of the substrate, a height "Z" of the gate electrode 101 from the surface of the substrate, and a width "X" between facing sidewalls of the elevated source/drain structure 108 and the gate electrode 101. In particular, the tilt-angle "A" is selected such that shadow region 403 of the gate electrode 101 at least meets shadow region 404 of the elevated source/drain structure 107, while shadow region 402 of the elevated source/drain structure 108 does not meet shadow region 403 of the gate electrode 101, thus implanting the dosage of ions 401 into an exposed region 405 resulting in the formation of the halo implant region 112 depicted in FIG. 1f.

Figure 5:
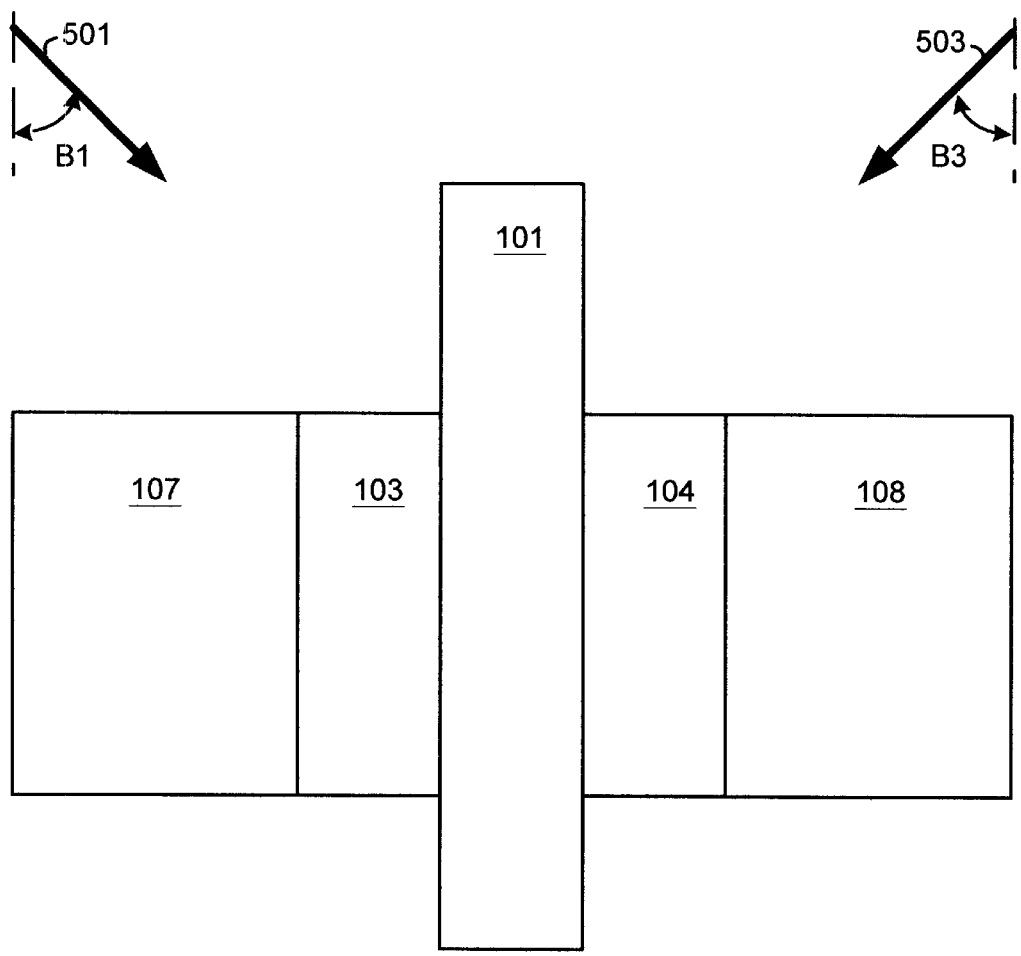
FIG. 5 illustrates, as an example, a top plan view of a semiconductor device substrate as four dosages of ions are tilt-angle implanted from four directions towards the substrate, utilizing aspects of the present invention.

FIG. 5 illustrates, as an example, a top plan view of a semiconductor device substrate as four dosages of ions 501~504 are tilt-angle implanted from four directions towards the substrate. Whereas FIG. 3 depicted a single dosage of ions 301 being tilt-angle implanted from one direction towards a gap created by the removal of the disposable spacer 105 between the gate electrode 101 and the elevated source/drain structure 107, in practice, it is preferable to have at least two dosages of ions 501 and 502 being tilt-angle implanted towards the gap. In such a case, one dosage of ions 501 is tilt-angle implanted from a first direction (indicated by the arrow) at a first non-perpendicular angle "B1" along the top surface of the substrate, and a second dosage of ions 502 is also tilt-angle implanted from a second direction (indicated by the arrow) at a second non-perpendicular angle "B2" along the top surface of the substrate. The first and second non-perpendicular angles "B1" and "B2" are selected in consideration of the height "Y" of the elevated source/drain structure 107 and the tilt-angle "A". A 45 degree angle for the first non-perpendicular angle "B1" from an axis shown by the dotted line in the figure that is parallel to the surface of the sidewall of the gate electrode 101, and a 135 degree angle for the second non-perpendicular angle "B2" from an axis shown by another dotted line in the figure that is also parallel to the surface of the sidewall of the gate electrode 101), are found to be especially appropriate for forming a suitably shaped halo implant region 111 in the lightly doped source/drain region 103.

Likewise, whereas FIG. 4 depicted a single dosage of ions 401 being tilt-angle implanted from another direction towards a gap created by the removal of the disposable spacer 106 between the gate electrode 101 and the elevated source/drain structure 108, in practice, it is preferable to have at least two dosages of ions 503 and 504 being tilt-angle implanted towards the gap. In such a case, one dosage of ions 503 is tilt-angle implanted from a third direction (indicated by the arrow) at a third non-perpendicular angle "B3" along the top surface of the substrate, and a fourth dosage of ions 504 is also tilt-angle implanted from a fourth direction (indicated by the arrow) at a fourth non-perpendicular angle "B4" along the top surface of the substrate. The third and fourth non-perpendicular angles "B3" and "B4" are also selected in consideration of the height "Y" of the elevated source/drain structure 108 and the tilt-angle "A". A 45 degree angle for the third non-perpendicular angle "B3" from an axis shown by the dotted line in the figure that is parallel to the surface of the sidewall of the gate electrode 101, and a 135 degree angle for the fourth non-perpendicular angle "B4" from an axis shown by another dotted line in the figure that is also parallel to the surface of the sidewall of the gate electrode 101, are found to be especially appropriate for forming a suitably shaped halo implant region 112 in the lightly doped source/drain region 104.

Although the various aspects of the present invention have been described with respect to a preferred embodiment, it will be understood that the invention is entitled to full protection within the full scope of the appended claims.

I claim:

1. A method for forming a localized halo implant region, comprising:

tilt-angle implanting at least one dosage of ions toward a gap created by removal of a disposable spacer between a gate electrode and an elevated source/drain structure on a substrate so as to form a localized halo implant region in said substrate.

2. The method according to claim 1, wherein said localized halo implant region is formed in said substrate by utilizing shadow effects of said gate electrode and said elevated source/drain structure.

3. The method according to claim 1, wherein said tilt-angle implanting comprises:

tilt-angle implanting a first dosage of ions from a first direction along a surface of said substrate; and tilt-angle implanting a second dosage of ions from a second direction along said surface of said substrate.

4. The method according to claim 1, wherein said tilt-angle implanting comprises tilt-angle implanting said at least one dosage of ions into a lightly doped source/drain region.

5. The method according to claim 4, wherein said lightly doped source/drain region comprises excess donor ions, and said at least one dosage of ions comprises acceptor ions.

6. The method according to claim 4, wherein said lightly doped source/drain region comprises excess acceptor ions, and said at least one dosage of ions comprises donor ions.

7. The method according to claim 1, wherein said tilt-angle is selected in consideration of a height of said elevated source/drain structure from said surface of said substrate, a height of said gate electrode from said surface of said substrate, and a width between facing sidewalls of said elevated source/drain structure and said gate electrode.

8. The method according to claim 7, wherein said height of said gate electrode is greater than said height of said elevated source/drain structure.

9. The method according to claim 3, wherein said first and said second directions are selected in consideration of said tilt-angle and a height of said elevated source/drain structure from said surface of said substrate.

10. The method according to claim 9, wherein said first direction along said surface of said substrate is at approximately a 45-degree angle relative to a sidewall of said gate electrode.

11. The method according to claim 9, wherein said second direction along said surface of said substrate is at approximately a 135-degree angle relative to said sidewall of said gate electrode.

12. A method for forming a localized halo implant region, comprising:

implanting a first dosage of ions of a first type toward a surface of a substrate having a gate electrode formed thereon, so as to form a lightly doped region adjacent to said gate electrode;

forming a disposable spacer on a sidewall of said gate electrode;

forming an elevated source/drain structure adjacent to said disposable spacer;

implanting a second dosage of ions of said first type toward said surface of said substrate so as to form a heavily doped region adjacent to said disposable spacer;

removing said disposable spacer; and tilt-angle implanting at least one dosage of ions of a second type toward a gap created by said disposable spacer having been removed so as to form a localized halo implant region in said substrate.

13. The method according to claim 12, wherein said localized halo implant region is formed by utilizing shadow effects of said gate electrode and said elevated source/drain structure.

14. The method according to claim 12, wherein said first dosage of ions comprises an N– dosage.

15. The method according to claim 14, wherein said second dosage of ions comprises an N+ dosage.

16. The method according to claim 15, wherein said at least one dosage of ions comprises a P– dosage.

17. The method according to claim 12, wherein said tilt-angle implanting comprises:

tilt-angle implanting a third dosage of ions from a first direction along said surface of said substrate; and tilt-angle implanting a fourth dosage of ions from a second direction along said surface of said substrate.

18. The method according to claim 12, wherein said tilt-angle is selected in consideration of a height of said elevated source/drain structure from said surface of said substrate, a height of said gate electrode from said surface of said substrate, and a width separating facing sidewalls of said source/drain structure and said gate electrode.

19. The method according to claim 18, wherein said height of said gate electrode is greater than said height of said elevated source/drain structure.

20. The method according to claim 17, wherein said first and said second directions are selected in consideration of said tilt-angle and a height of said elevated source/drain structure relative to said surface of said substrate.

21. The method according to claim 20, wherein said first direction along said surface of said substrate is at approximately a 45-degree angle relative to said sidewall of said gate electrode.

22. The method according to claim 20, wherein said second direction along said surface of said substrate is at approximately a 135-degree angle relative to said sidewall of said gate electrode.

* * * * *